(12) United States Patent
Johnson et al.

(10) Patent No.: US 9,929,031 B2
(45) Date of Patent: Mar. 27, 2018

(54) METHODS AND DEVICES FOR SECURING AND TRANSPORTING SINGULATED DIE IN HIGH VOLUME MANUFACTURING

(71) Applicant: INTEL CORPORATION, Santa Clara, CA (US)

(72) Inventors: John C. Johnson, Phoenix, AZ (US); Eric J. Moret, Beaverton, OR (US); Lawrence M. Palanuk, Portland, OR (US); Gregory A. Stone, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/295,943

(22) Filed: Oct. 17, 2016

(65) Prior Publication Data

US 2017/0032991 A1    Feb. 2, 2017

Related U.S. Application Data

(62) Division of application No. 15/050,387, filed on Feb. 22, 2016, now Pat. No. 9,496,161, which is a division
(Continued)

(51) Int. Cl.
*H01L 21/673* (2006.01)
*H01L 21/78* (2006.01)
(Continued)

(52) U.S. Cl.
CPC .. *H01L 21/67333* (2013.01); *H01L 21/67265* (2013.01); *H01L 21/67309* (2013.01);
(Continued)

(58) Field of Classification Search
CPC combination set(s) only.
See application file for complete search history.

(56) References Cited

U.S. PATENT DOCUMENTS

| | | |
|---|---|---|
| 5,090,579 A | 2/1992 | Major |
| 5,754,391 A | 5/1998 | Bates |

(Continued)

OTHER PUBLICATIONS

Entegris, Inc., "A300 G3 FOUP", [online], © 2001-2007, [WaybackMachine Snapshot dated Jun. 9, 2007], retrieved from Internet at <URL: https://web.archive.org/web/20070527011044/http://www.wafercare.com/Default.asp?G=97>, 2 pp.
(Continued)

*Primary Examiner* — Mamadou Diallo
(74) *Attorney, Agent, or Firm* — Konrad Raynes Davda & Victor LLP; Alan S. Raynes

(57) ABSTRACT

A method includes identifying a wafer position for a plurality of die on a wafer, storing the wafer position for each of the plurality of die in a database, dicing the wafer into a plurality of singulated die, positioning each of the singulated die in a die position location on a tray, and storing the die position on the tray for each of the singulated die in the database. The database includes information including the wafer position associated with each die position. The tray is transported to a processing tool, and at least one of the plurality of singulated die is removed from the die position on the tray and processed in the processing tool. The processed singulated die is replaced in the same defined location on the tray that the singulated die was positioned in prior to the processing. Other embodiments are described and claimed.

22 Claims, 8 Drawing Sheets

Related U.S. Application Data of application No. 14/142,761, filed on Dec. 28, 2013, now Pat. No. 9,305,816.

(51) Int. Cl.

| | | |
|---|---|---|
| *H01L 21/677* | (2006.01) | |
| *H01L 21/683* | (2006.01) | |
| *H01L 21/687* | (2006.01) | |
| *H05K 13/00* | (2006.01) | |
| *H01L 21/68* | (2006.01) | |
| *H01L 21/67* | (2006.01) | |

(52) U.S. Cl.
 CPC .. *H01L 21/67356* (2013.01); *H01L 21/67363* (2013.01); *H01L 21/67383* (2013.01); *H01L 21/67769* (2013.01); *H01L 21/67772* (2013.01); *H01L 21/67778* (2013.01); *H01L 21/68* (2013.01); *H01L 21/6833* (2013.01); *H01L 21/68764* (2013.01); *H01L 21/68771* (2013.01); *H01L 21/78* (2013.01); *H05K 13/0084* (2013.01)

(56) References Cited

U.S. PATENT DOCUMENTS

| | | |
|---|---|---|
| 6,078,845 A | 6/2000 | Friedman |
| 7,061,123 B1 * | 6/2006 | Chee .................. H01L 23/5389 257/777 |
| 8,269,605 B2 | 9/2012 | Moore |
| 8,315,730 B2 | 11/2012 | Jones et al. |
| 8,317,107 B2 | 11/2012 | Buot et al. |
| 9,305,816 B2 | 4/2016 | Johnson et al. |
| 9,496,161 B2 | 11/2016 | Johnson et al. |
| 2003/0102016 A1 | 6/2003 | Bouchard |
| 2004/0181938 A1 * | 9/2004 | Suzuki ................. G05B 19/128 29/832 |
| 2007/0015120 A1 * | 1/2007 | Ide ........................... G09B 1/08 434/150 |
| 2014/0091458 A1 * | 4/2014 | Van Gemert ......... H01L 21/568 257/737 |
| 2014/0110826 A1 * | 4/2014 | Buenning ............... H01L 21/78 257/618 |
| 2014/0184255 A1 | 7/2014 | Johnson et al. |
| 2014/0268780 A1 | 9/2014 | Wang et al. |

OTHER PUBLICATIONS

Entegris, Inc., "F300 Autopod Wafer Carrier", © 2002, 4 pp.
Entegris, Inc., "F300 Autopod Wafer Carrier", © 2001-2012, 2 pp.
Entegris, Inc., "Spectra Foup", © 2006, 2 pp.

* cited by examiner

METHODS AND DEVICES FOR SECURING AND TRANSPORTING SINGULATED DIE IN HIGH VOLUME MANUFACTURING

This application is a divisional of U.S. patent application Ser. No. 15/050,387 filed Feb. 22, 2016, issued as U.S. Pat. No. 9,496,161, which is a divisional of U.S. patent application Ser. No. 14/142,761 filed Dec. 28, 2013, issued as U.S. Pat. No. 9,305,816.

RELATED ART

Processing of modern electronics devices typically includes some sort of device traceability during the production process. The term "die" generally refers to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. Current identification practices may utilize an identification (ID) mark etched into a wafer and an x,y coordinate location of the die on the wafer. In addition, during a first wafer-level test, ID fuses in the die may be set while the die is still part of the wafer, so that upon subsequent process operations after the die has been singulated, the die may be read electronically during subsequent process operations after the die has been separated from the wafer.

BRIEF DESCRIPTION OF THE DRAWINGS

Embodiments are described by way of example, with reference to the accompanying drawings, which are not necessarily drawn to scale.

DETAILED DESCRIPTION

Reference below will be made to the drawings, where in order to show the structures of various embodiments most clearly, the drawings include diagrammatic representations of various structures. Thus, the actual appearance of the fabricated structures may appear different while still incorporating the claimed structures of the illustrated embodiments. Moreover, the drawings may show only the structures necessary to understand the illustrated embodiments. Additional structures known in the art have not been included to maintain the clarity of the drawings.

Certain embodiments relate to die level manufacturing processes, in which individual die that have been singulated from a wafer are delivered to a tray, and the wafer origination position and tray position of each die is stored so that during various processing procedures each die can be traced to the specific location on the wafer it originated from. Certain system embodiments include the use of singulated device trays, a container for the trays, and process management methodology. Such systems can be used to create a process for containing, transporting, processing, and managing singulated devices in a high volume manufacturing environment.

Figure 1:
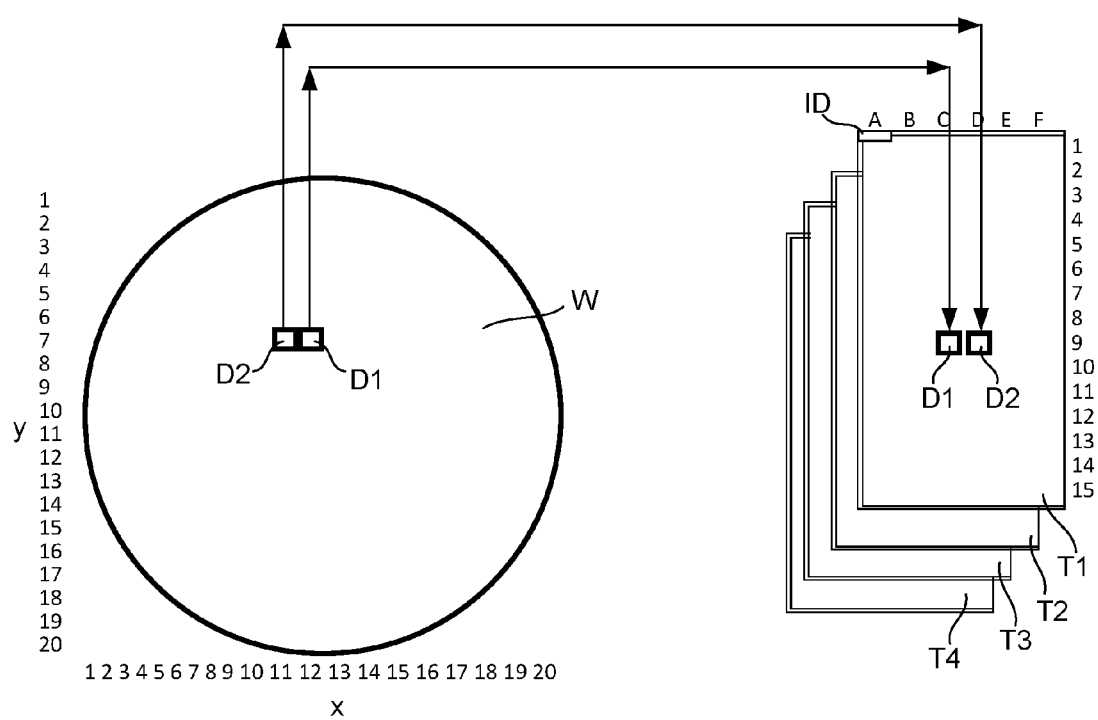
FIG. 1 illustrates a view of a system including a wafer and a plurality of trays, including the wafer position of a die and the tray position the die is delivered to, in accordance with certain embodiments.

FIG. 1 illustrates a wafer W having a surface that may be defined using an x, y coordinate system, with the x and y values appropriate to the number of die positions present on the wafer. A plurality of die may be defined on the wafer W. FIG. 1 also illustrates a plurality of trays T1, T2, T3, and T4, adapted to receive a plurality of die from the wafer W. The trays may include a surface that may be defined using columns labeled as A-F, and rows labeled as 1-15. Any suitable method for defining the surface may be utilized. Any suitable device may be used to pick and place die from the wafer W onto the trays T1-T4.

As illustrated in FIG. 1, a plurality of die including die D1 and D2 are singulated from the wafer W and positioned on a tray T1, as indicated by the arrows extending from the wafer to the tray T1. The die D1 originated at wafer position in the x-direction of 11 and in the y-direction of 7. The die D2 originated at wafer position in the x-direction of 12 and in the y-direction of 7. The die D1 is placed in the tray T1 at column C, row 9. The die D2 is placed in the tray T1 at column D, row 9. Information including the wafer origination position and the tray position for the die D1 and D2 may be stored in a database of information that is accessible by other equipment in the process flow, so that traceability is maintained throughout the processing procedures.

Figure 2:
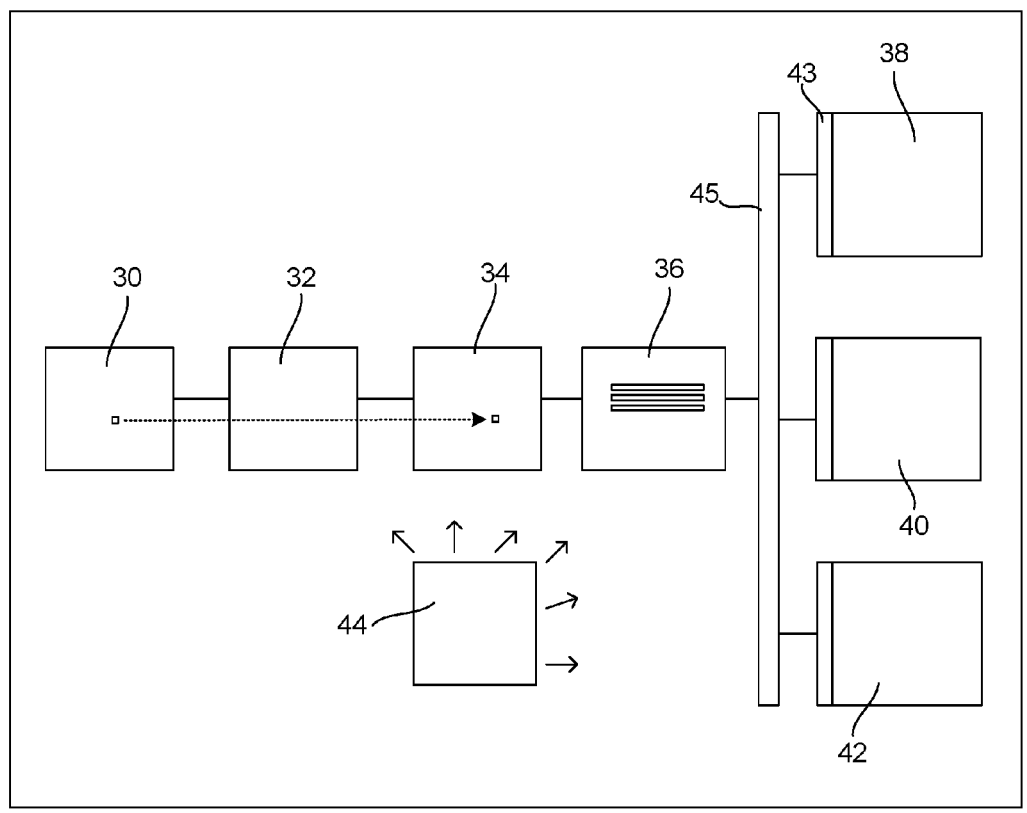
FIG. 2 illustrates a processing system in accordance with certain embodiments.

FIG. 2 illustrates a system in accordance with certain embodiments, including various components (in block form) that may be utilized for providing die traceability and transport during processing operations in an automated system. A die singulation component 30 includes a suitable mechanism for dicing one or more wafers. The wafer may be mounted on a suitable mounting medium and then diced into individual die. A pick and place component 32 may be utilized to grasp the singulated die and deliver it to the desired location on a tray component 34, as indicated by the dotted line. Depending on the number of singulated die, the tray component 34 may include a plurality of trays. The tray may be any suitable tray for storing a plurality of singulated die and transferring the die. In certain embodiments, once a die is assigned to a tray and a location in the tray, it maintains this assignment throughout the manufacturing process flow, thus minimizing the chances of product mixing.

Embodiments including trays having a variety of configurations, including, but not limited to, configurations including pocket regions, configurations utilizing electrostatic forces to hold the die to the tray, configurations including an adhesive to couple the die to the tray, and configurations including a tray lid to assist in die protection and ensuring that the die remains in the desired location in the tray. The trays may have a suitable identifying feature thereon so that one tray can be distinguished from another tray, including, but not limited to, an RFID tag and/or a two dimensional physical mark that may be observed visually or with another wavelength of radiation. Such identifying features may be electronically traceable so that the tray can be identified at any time during the processing operations. An example of an identifying feature on tray T1 in FIG. 1 is the rectangular box labeled ID. The trays may in certain embodiments follow JEDEC (Joint Electron Device Engineering Council) standards for external dimensions and features such as two dimensional ID locations, thickness, nesting, etc. as known in the art.

The one or more trays of the tray component 34 may be positioned in a container (or carrier) component 36 adapted to hold multiple trays therein. The container component 36 holds the trays and facilitates batch material processing, movement, storage, and identification. As illustrated in FIG. 2, the container component 36 and trays therein may be delivered to various processing equipment such as processing tools 38, 40, 42 for additional operations. The container component 36 may be positioned in an automated loading system 45, and distributed back and forth from the desired processing tool 38, 30, 42 through a load port on the tool, such as load port 43 on tool 38. Only trays needed for the current process operations are taken out of the container 36 and delivered to the tool's processing area. In certain embodiments the die may be kept in the tray until the actual point of processing and the die is returned to the tray immediately after the processing operation. The container and trays therein may act as a buffer for holding the die until delivered to the specific tool for processing. As a result, in such embodiments, there may be no need for an intermediate buffer to hold the die prior to being delivered to a tool for processing. In addition, in certain embodiments, very few die are removed from a tray at any one time for processing. As a result, if a manufacturing tool malfunctions or has a process excursion, only a few die will be at risk and recovery of the product from the tool is simplified. In addition, it is relatively cost effective to scrap the relatively few die that have undergone an excursion in the manufacturing tool while being processed. This eliminates that likelihood that such excursion die become inadvertently damaged during recovery and contain quality or reliability defects.

The system illustrated in FIG. 2 also includes a database component 44, which is information stored on any suitable device (e.g., computer), including the wafer origination position and tray position for each die delivered to a tray. The information may be stored as a map or other type of suitable data structure that can be accessed by various components in the system. When multiple trays are utilized, the database may also include information regarding which tray is positioned in which location within the carrier. The database information may be used in a variety of ways. For example, upstream manufacturing data may suggest that die from different origination areas on the wafer will require different processing operations. By knowing the original wafer position and current tray position for each die, such different processing operations for different die on a tray can be accommodated, with the processing tool recipe including a tray map pick and place order for processing the die in a tray. In addition, if it is known that die from different origination areas will require different processing operations, then the die may be proactively placed on the appropriate tray and/or in the appropriate sequence/position on a tray during initial population of the tray, for more efficient processing.

In addition, where multiple wafers are being processed, each fab wafer may be singulated and placed on multiple trays utilizing a methodology that ensures matched wafer populations in each tray. Such a configuration enables rapid disposition of yield problems as equipment or material related. It should be noted that processing tools generally include a tool recipe for performing the processing operations. The recipe may utilize the information from the database to ensure that the desired die are all properly processed.

When problems such as yield degradation occur during a processing operation, the ability to trace the wafer position each die came from may be used to help determine whether the yield degradation is material based or equipment based. For example, if there are multiple trays that each contain die representing all regions of the original wafer, then the trays can be sent to different tools for processing. If the expected results from all tools show yield degradation, then it is likely that the problem is wafer related. If the expected results from only a single tool show yield degradation, then it is likely that the problem is tool related.

Figure 3:
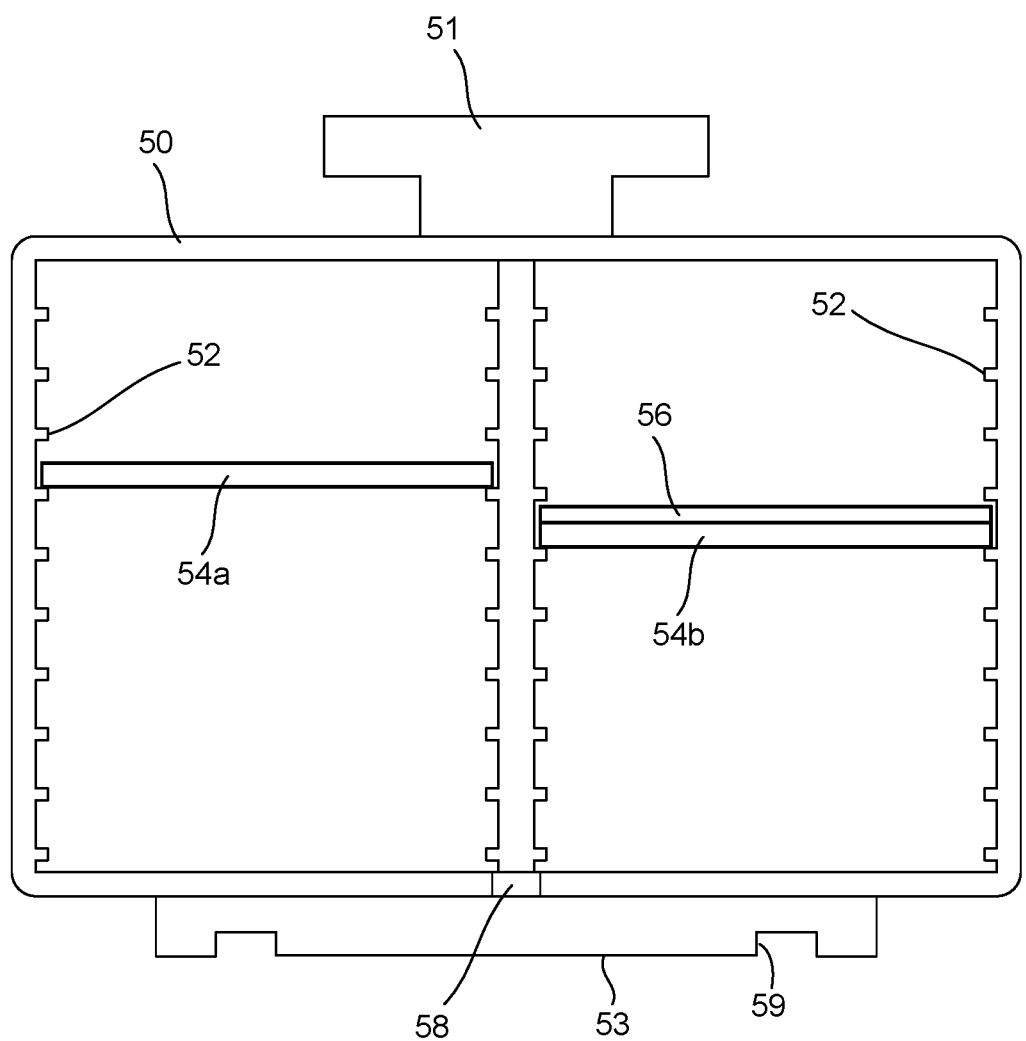
FIG. 3 illustrates a carrier adapted to hold a plurality of trays, in accordance with certain embodiments.

FIG. 3 illustrates an embodiment of a container or carrier 50 adapted to hold one or more trays therein. A variety of configurations are possible. The container 50 may in certain embodiments utilize the 300 mm SEMI (Semiconductor Equipment and Materials International) specifications and features as known in the art for automated transport and storage, door remove/placement, compatible base plate for standard 300 mm load ports and Kinematic Coupling (KC) Interface, and RFID identification. An ID tag 58 may in certain embodiment be positioned near a front region of the container. The carrier 50 embodiment illustrated in FIG. 3 includes a plurality of shelf or rail regions 52 adapted to support a tray such as trays 54a and 54b. The carrier 50 may also include a door for accessing the trays. In certain embodiments the door may be removable. As noted above, in certain embodiments a tray may include a lid, such as lid 56 positioned on tray 54b on the right hand side of the carrier 50. The lid may be adapted to assist in limiting the movement of die in the tray during transport and may also act to shield the die in the tray from foreign matter. The lid may in certain embodiments be relatively thin and fit within the Z profile of the tray. In other embodiments, the lid may be sized and configured so that it cannot be removed from the tray once the tray is positioned on the rails 52 in the container. The lid in certain embodiments may also include features than extend into a region such as a pocket on the tray to contain a die and inhibit an out of pocket or device migration situation from occurring. In addition, in certain embodiments, lidded trays are directly stackable on one another.

The container 50 illustrated in FIG. 3 includes a structure that carries trays individually on rails or shelves 52, so that two columns of trays may be supported. Carrying the trays individually on the shelves enables sub-batch processing on equipment with full random access to any tray without the need for tray stacking equipment. The container 50 as illustrated in FIG. 3 also includes features that permit its use in automated systems, including, but not limited to, a protrusion 51 extending upward from an upper surface of the container 50, and a patterned lower surface configured to engage a load port on a tool. The protrusion 51 may in certain embodiments be substantially T-shaped in cross section. The patterned lower surface 53 may include one or more grooves 59 positioned therein.

Figure 4:
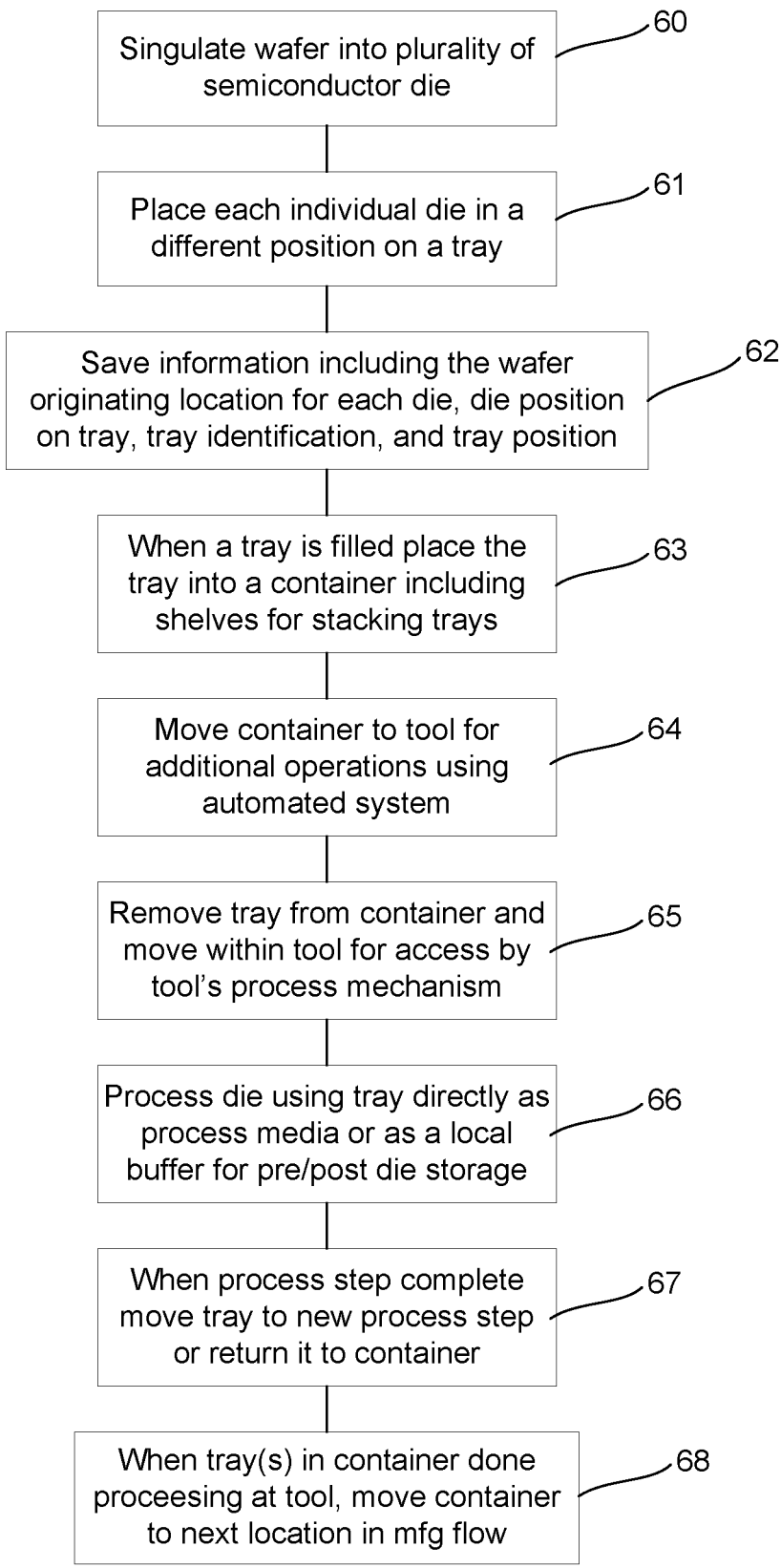
FIG. 4 illustrates a flowchart of operations in accordance with certain embodiments.

FIG. 4 is a flowchart of operations that may be carried out in accordance with certain embodiments. Box 60 is singulating a wafer into a plurality of semiconductor die. Box 61 is placing each individual die in a different position on a tray. A variety of tray configurations may be used. Box 62 is saving information including, but not limited to, the location on the wafer where each individual die originated, the position on the tray where the die is placed, the specific tray used. Box 63 is placing the tray into a container including shelves for stacking multiple trays. The position of the tray in the container may be included in the saved information. Box 64 is moving the container to tool locations for additional processing operations, with the container and tray acting as a buffer to hold the die prior to its being positioned in the tool. Box 65 is removing a tray from the container and moving the tray within the tool for access by the tool's process mechanism. Box 66 is processing the die using the tray directly as process media or as a local buffer for pre/post die storage. Box 67 is moving the tray to a new process step within the tool or if all the processing within the tool is complete, returning the tray to the container. Another tray may then be removed from the container for processing if called for by the tool recipe. Box 68 is moving the container the next location in the manufacturing process flow after all trays are returned to the container. These operations may be carried out in an automated manner within a processing system. Various modifications to the above operations may be made.

Various embodiments enable batching, distributing, tracing, and tracking of devices that are singulated without any means of individual self-identification. Once the initial population of devices into a tray is performed, a tray map with the desired information is uploaded to the automation databases. By maintaining the relationship between the trays and device's position in the tray, and the device's identification from the originating material batch, every device can be tracked individually through the manufacturing flow. For example, in the case of singulated die devices, traceability is maintained between the wafer lot, the wafer, the die X/Y position on the wafer to the individual position on the specific tray, and then to a specific slot in the container. This relationship may be validated at each process operation in the manufacturing flow to ensure proper device manufacturing. In addition, when desired, tray to tray sub batch comparisons for a single wafer may be carried out easily and efficiently, as well as wafer to wafer and lot to lot comparisons.

Figure 5:
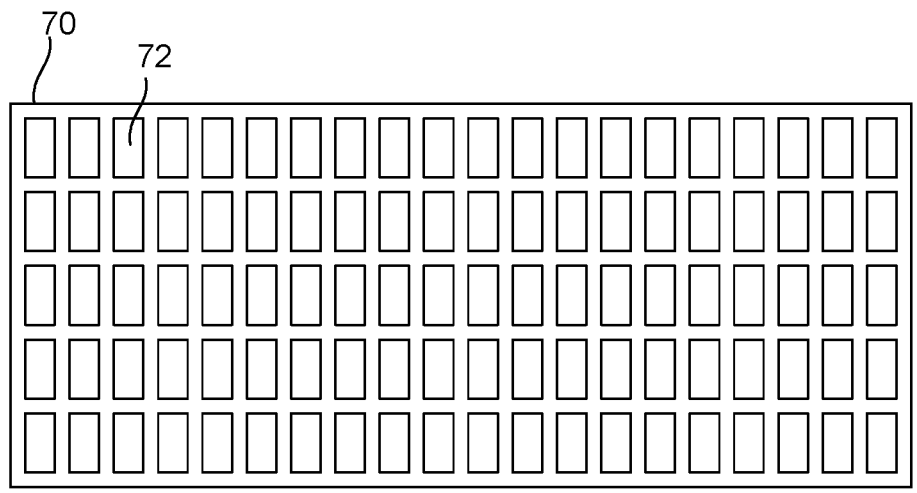
FIG. 5 illustrates a pocketed tray that may be utilized in accordance with certain embodiments.
Figure 6:
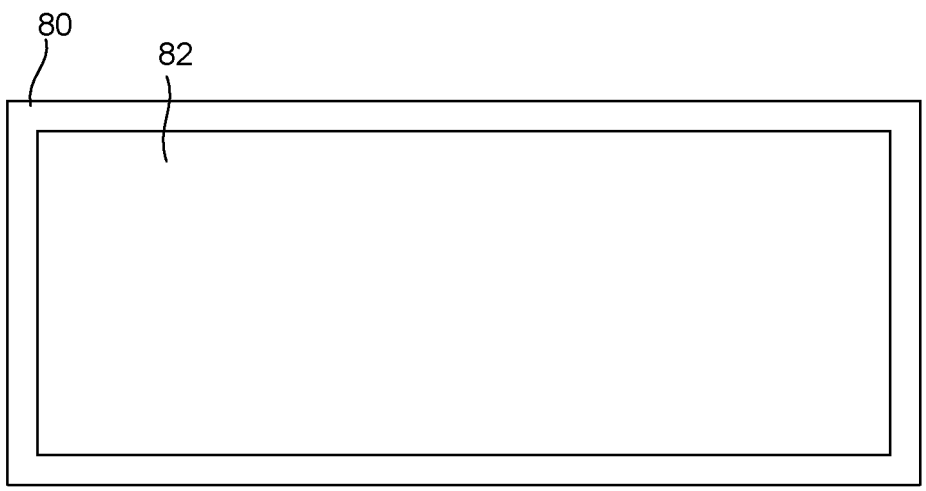
FIG. 6 illustrates an adhesive tray that may be utilized in accordance with certain embodiments.

A noted above, a variety of tray structures may be utilized, including, but not limited to, pocketed trays, adhesive trays, and electrostatic trays. FIG. 5 illustrates a pocketed tray 70 that may be utilized in certain embodiments. In certain embodiments the pocketed tray 70 including a plurality of pocket regions 72 each sized to accept a single die. The pocket regions 72 act to confine the movement of the die therein. FIG. 6 illustrates an adhesive tray 80 that may be utilized in certain embodiments. The adhesive tray 80 include an adhesive layer 82 positioned thereon. Any suitable adhesive material may be used. In certain embodiments the adhesive layer 82 may comprise a tape.

Certain embodiments relate to the use of an electrostatic tray or chuck to hold die during various assembly processes. Electrostatic chucks or trays hold a body in place via electrostatic force induced due to dipoles being created near the surface of the body. Electrostatic chucks or trays may in certain configurations includes a core material as the backbone of the device, metal electrodes to carry a static charge, dielectric material positioned on the electrodes, and optionally a protective layer on the dielectric material.

Electrostatic chucking devices have been formed using materials such as silicon and quartz as core materials, with various metallic electrodes and dielectric materials such as silicon dioxide and silicon nitride. Such chucks have typically been used in static tools during, for example, various silicon fabrication processes including those performed in vacuum. Chucks made using core materials such as silicon and quartz tend to be somewhat brittle and may prove to be unreliable and prone to damage when subject to repeated handling, die placement (for example, nozzle-based die placement), and transportation and shipping.

Certain embodiments relate to the formation and use of polymer material based electrostatic chucking structures such as trays during various processing operations. Such processing operations may include, but are not limited to, device fabrication, handling, assembly, testing, cleaning, and transportation. Such polymer based materials may include PCB (printed circuit board) materials used in the substrate/board industry. Such trays may in certain embodiments be designed with a known JEDEC tray form factor in order to permit the use and transfer of the trays within a tool as well as efficient storage of multiple trays inside stockers or FOUPs (front opening unified pods).

Figure 7:
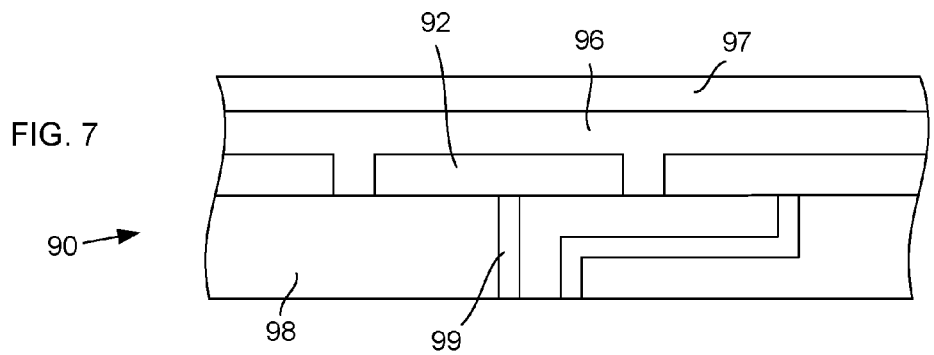
FIG. 7 illustrates a view of an electrostatic tray design that may be utilized in accordance with certain embodiments.

FIG. 7 illustrates a cross-sectional view of a PCB based electrostatic tray/chuck design example in accordance with certain embodiments. The tray 90 includes electrodes 92 positioned on a core 98, with a dielectric layer 96 positioned on the electrodes 92 and extending therebetween. An optional protective layer 97 may be positioned if desired on the dielectric layer 96, in order to protect the dielectric layer from damage. Electrical coupling to the electrodes 92 may be made through electrical pathways 99. In certain embodiments, the core 98 may be formed from a PCB material including, but not limited to, fiberglass, polyimides, and other polymeric and/or composite materials. For example, in certain embodiments, PCB processing techniques including, but not limited to, lamination of thin layers, may be used for forming the core 98.

The core 98 acts to provide mechanical strength and durability for the electrostatic media, and PCB materials are well suited for such an application. Suitable dielectric layer 96 materials include, but are not limited to, polymeric materials with high relative permittivity, such as, for example, polyimides, acrylics, and liquid crystal polymers. Electrodes 92 may be formed from any suitable material, including, but not limited to, metals used in the substrate/board industry such as, for example, copper, tungsten, and titanium. In certain embodiments, the top protective layer 97 material should be selected to be compliant in order to reduce any air gap between the die and the electrostatic chuck. Such materials include, but are not limited to, polymeric materials such as acrylics and polyimides.

Figure 8A:
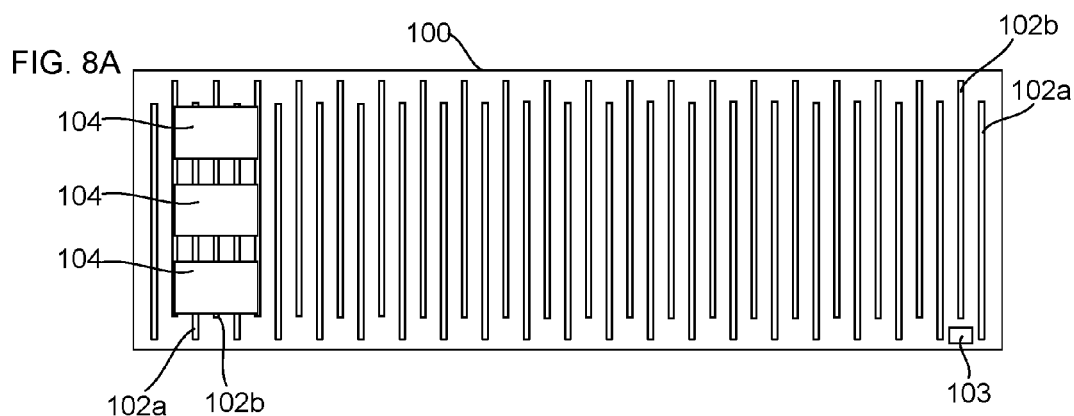
FIGS. 8A-8C illustrate electrostatic tray configurations, in accordance with certain embodiments.
Figure 8B:
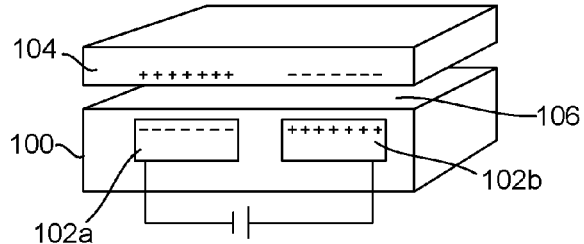

The electrode pattern near the top surface of the electrostatic chuck significantly influences the grip pressure and thus the performance of the device. FIG. 8A illustrates an electrostatic tray 100 in accordance with certain embodiments. The electrostatic tray 100 includes embedded alternating electrodes 102a, 102b positioned on a core and including a dielectric layer positioned thereon. In the view of FIG. 8A, the dielectric layer is clear and the electrodes 102a, 102b are visible. An optional uppermost protective layer may also be present on the dielectric layer. The electrodes 102a, 102b have an interdigitated layout, with every other electrode 102a, 102b having the same charge. A variety of electrode layouts are possible. Three chucked die 104 are illustrated on the left hand portion of the tray 100. Upon application of charge to the electrodes 102a, 102b, an opposite charge induction is generated in the die 104 and a grip pressure between the die and the tray is created. The grip pressure is proportional to the chucking voltage, the relative permittivity of the dielectric material used in the chuck, and inversely proportional to the dielectric thickness and the gap size (between the dielectric and the die). A position for FIG. 8B illustrates a schematic of the dotted line portion of FIG. 8A including a portion of a die 104 positioned above a dielectric material 106 under which the electrodes 102a, 102b are positioned. A representation of the charges that are induced to generate a grip pressure to hold the die 104 to the tray 100 are shown. Electrode 102a has a negative charge, and electrode 102b has a positive charge. Within the die 104 a positive charge is induced adjacent to the negative charge of the electrode 102a, and a negative charge is induced adjacent to the positive charge of the electrode 102b. As a result, a downward grip pressure is generated to hold the die 104 on the electrostatic tray 100.

Figure 8C:
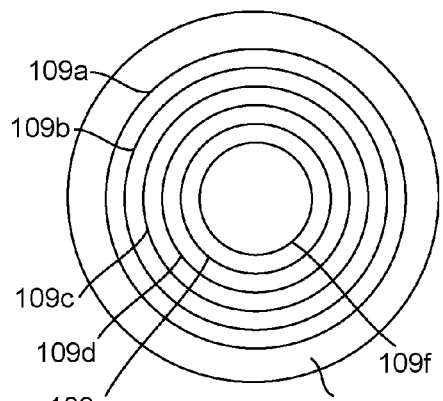

The electrode pattern significantly determines the grip pressure for the electrostatic tray. The die 104 is held between oppositely charged electrodes, and the grip pressure is a function of the electric field (voltage) that exists between the electrodes. Thus a network of oppositely charged electrodes spaced optimally apart to form a significant dielectric field between the die and the tray is needed for efficient performance of the electrostatic tray/chuck. A variety of patterns, including, but not limited to, the comb-like pattern of FIG. 8A, may be suitable for the purpose of chucking die on a tray for tool movement, shipping, and storage. In certain embodiments, a configuration such as in FIG. 8A may be formed to include alternating electrodes of opposite charge, spaced apart by 1-3 mm, to achieve suitable chucking efficiency. Other electrode configurations (and tray configuration) are also possible. For example, a circular tray 107 including an electrode pattern comprising concentric electrodes 109a-109f is illustrated in FIG. 8C.

An electrostatic tray/chuck in accordance with certain embodiments may also include a number of on-board components, for example, surface mounted to the board, to provide add-on features and capabilities. Examples include on-board rechargeable batteries to provide a constant source of charge, a voltage regulator component to enable changing the voltage when desired, and other components for interacting with tool automation and software. The presence of an on-board battery system and voltage regulation enables changing the voltage of the electrostatic tray/chuck right on the tray itself. This permits the tray to be optimized based on the operation, for example, relatively lower voltages such as, for example, 700-800V, might be used for within a tool die pick and place operation, whereas relatively higher voltages such as, for example, 1000-1500V, might be used for shipping electrostatic trays with die on them. Applied voltages may also be adjusted based on the size of the die being chucked on the tray. An example of an on-board component such as a battery and its location on a tray, in accordance with certain embodiments, is illustrated in FIG. 8A.

In addition, for die storage using an electrostatic tray/chuck, charge dissipation over time may need to be managed via design and materials chosen. An on-board capacitor may also be included in the design to keep the electrostatic chuck charged for longer time periods. Other parameters such as battery capacity and cycle charge times may also be managed as determined by the desired performance. Dimensional control may be managed by reducing the thickness of the core and the on-board components such as batteries.

Electrostatic chucking structures may tend to gather foreign materials (FM) such as particles, fibers, etc. from the environment due to the presence of static charge on the surface. Such FM may be cleaned by blowing a gas, wiping, or rolling because the FM are loosely held at the surface, in particular when the charge is turned off. Such cleaning may be added at a given operation/tool or may be added to an existing operation/tool, as a FOL (front-of-line) or EOL (end-of-line) operation.

Electrostatic chucking media for various processes may provide efficiency advantages over media such as pocketed trays. Without the need to form a pocket around each die, an electrostatic tray may permit more area to be used for positioning die and thus can hold more die than a similar sized pocketed tray. In certain embodiments, a tray may include about 100-300 die positioned thereon.

As described above, certain embodiments also relate to tray support and handling, including the use of containers (or carriers) for holding and transporting trays on which a plurality of die are positioned. The containers may comprise tray-automated front opening shipping boxes (T-AFOSBs) in which the trays are moved and distributed between various tools and equipment in an automated manner. The containers may be formed in accordance with known standards such as JEDEC standards. One example of a container is illustrated in FIG. 3, in which trays are positioned on rails in the container.

As described above, trays may include a lid positioned thereon. The lid may act to inhibit the movement of the die on the tray and to protect the die during transport. FIGS. 9A-12B illustrate features that may be included on lids or on the rails in a container, in accordance with certain embodiments.

Figure 9A:
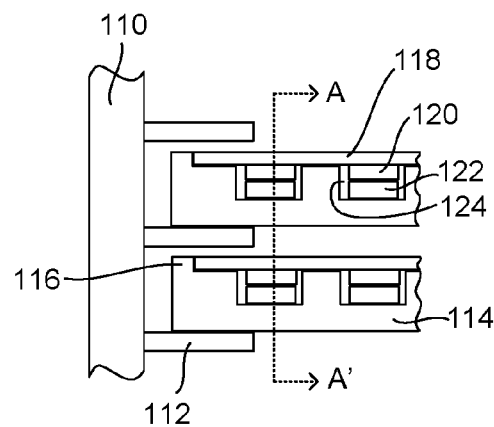
FIGS. 9A-9B illustrate a chamber including lidded trays positioned therein, in accordance with certain embodiments.
Figure 9B:
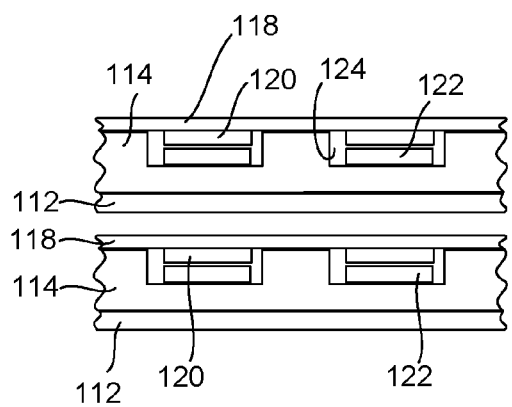

FIG. 9A illustrates a front cross-sectional view portion of a container including a sidewall 110 having shelves or rails 112. FIG. 9B is a side cross-sectional view along the dotted lines A-A' of FIG. 9A. Trays 114 are positioned on at least some of the rails 112. In the illustrated embodiment, the trays 114 each include a lid 118 positioned thereon. The trays 114 include a raised step 116 at an upper end region thereof, in order to properly position the lid 118 on the tray 114 and to inhibit motion of the lid 118. The lid 118 includes pedestal portions 120 extending downward therefrom. The pedestal portions 120 act to inhibit motion of the die 122 positioned in a pocketed region 124 in the tray 114. The pedestal portions and lid may be sized so that once the tray 114 is positioned on the rails 112, the lid cannot come off of the tray while in the container because there is insufficient clearance between the top of the lid 118 and the bottom of the rail 112 positioned above the lid 118.

Figure 10A:
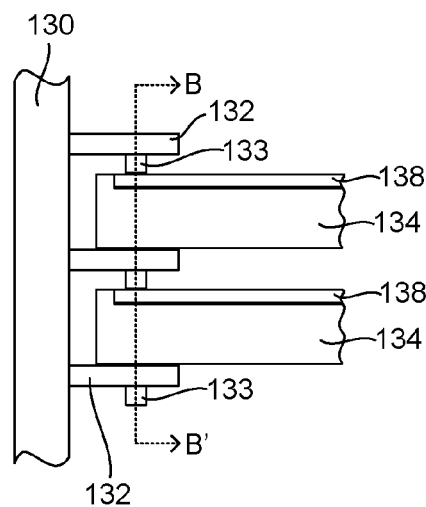
FIGS. 10A-10B illustrate a chamber including lidded trays positioned therein, in accordance with certain embodiments.
Figure 10B:
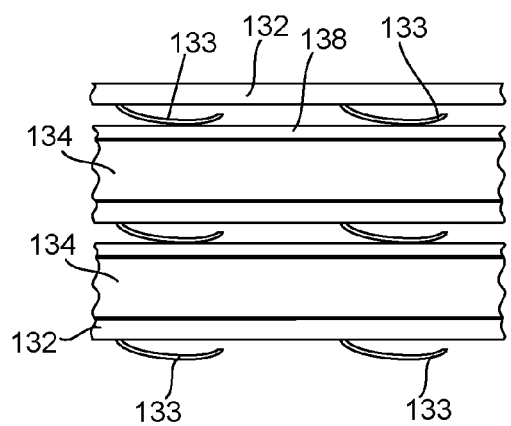

FIG. 10A illustrates a front cross-sectional view of portion of a container including a sidewall 130 having rails 132. FIG. 10B is a side cross-sectional view along the dotted line B-B' of FIG. 10A. Trays 134 having lids 138 are positioned on at least some of the rails 132. In the illustrated embodiment, the rails 132 include leaf spring structures 133 extending downward therefrom. The leaf spring structures 133 may be configured to include have a curvature that engages the upper surface of the lid 138 as the lidded tray is positioned in the container. The leaf spring structures 133 may be formed with a level of flexibility and stiffness such that as the spring is engaged, a force is applied to hold the lid 138 on the tray 134. The leaf spring structures 133 may be formed integral to a rail 132 or be formed as a separate component that is coupled to the rail 133. Other types of spring structures may also be utilized.

Figure 11A:
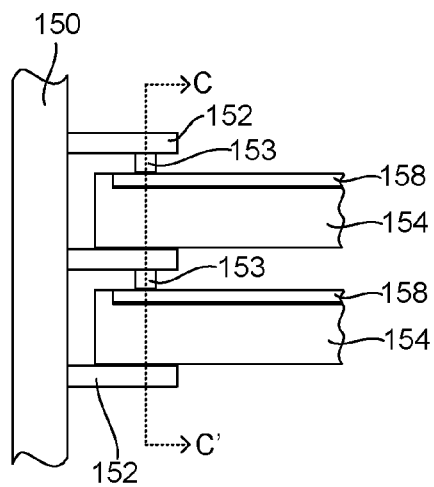
FIGS. 11A-11B illustrate a chamber including lidded trays positioned therein, in accordance with certain embodiments.
Figure 11B:
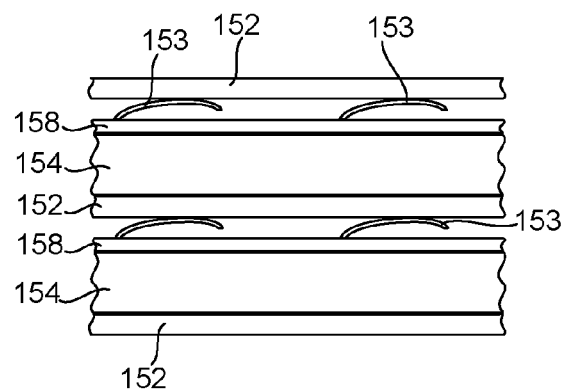

FIG. 11A illustrates a front cross-sectional view of portion of a container including a sidewall 150 having rails 152. FIG. 11B is a side cross-sectional view along the dotted line C-C' of FIG. 11A. Trays 154 having lids 158 are positioned on at least some of the rails 152. In the illustrated embodiment, the lids 158 include leaf spring structures 153 extending upward therefrom. The leaf spring structures 153 may be similar to the leaf spring structures 133 described in connection with FIGS. 10A-10B, with one difference being that the leaf spring structures 153 may be integral with or attached to the lid 158. The leaf spring structures 153 may be configured to include a curvature that engages the lower surface of the rail 152 as the lidded tray is positioned in the container. The leaf spring structures 153 may be formed with a level of flexibility and stiffness such that as the spring is engaged, a force is applied to the rail 152 that acts to hold the lid 158 on the tray 154. The leaf spring structures 153 may be formed integral to the lid 158 or be formed as a separate component that is coupled to the lid 158. Other types of spring structures may also be utilized.

Figure 12A:
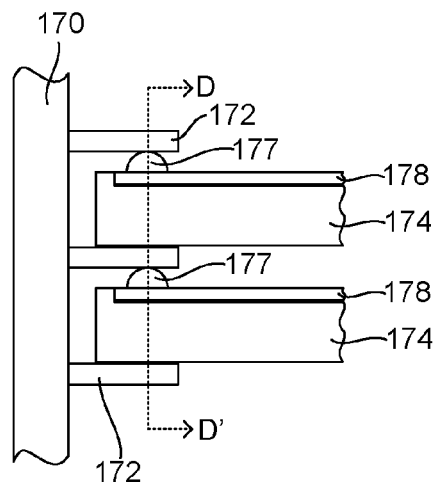
FIGS. 12A-12B illustrate a chamber including lidded trays positioned therein, in accordance with certain embodiments.
Figure 12B:
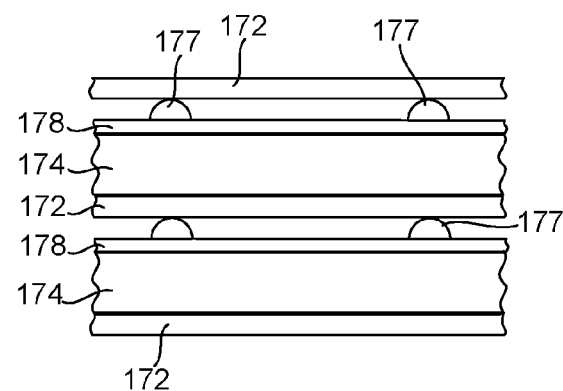

FIG. 12A illustrates a front cross-sectional view of portion of a container including a sidewall 170 having rails 172. FIG. 12B is a side cross-sectional view along the dotted line D-D' of FIG. 12A. Trays 174 having lids 178 are positioned on at least some of the rails 172. In the illustrated embodiment, the lids 178 include dome structures 157 extending upward therefrom. The dome structures 177 may be configured to include a curvature that engages the lower surface of the rail 172 as the lidded tray is positioned in the container. The dome structures 177 may be configured so that it deforms as it engages the rail 172, and applies a force to the rail 172 that acts to hold the lid 178 on the tray 174. In certain respects that dome structures 177 may act like springs. The dome structures 153 may be formed integral to the lid 178 or be formed as a separate component that is coupled to the lid 178. In another embodiment, dome structures may be positioned on the bottom surface of the rails. Other types of structures that engage the lid and rails may also be utilized.

Terms such as "first", "second", and the like may be used herein and do not necessarily denote any particular order, quantity, or importance, but are used to distinguish one element from another. The term "die" may refer to a single structure or to a plurality of structures. Terms such as "upper", "lower", "top", "bottom", and the like may be used for descriptive purposes only and indicate the relative positioning of various features. Embodiments may be manufactured, used, and contained in a variety of positions and orientations. The structures of various features in embodiments may be varied from those shown and described herein. In addition, embodiments may be manufactured, used, and contained in a variety of positions and orientations.

In the foregoing Detailed Description, various features are grouped together for the purpose of streamlining the disclosure. This method of disclosure is not to be interpreted as reflecting an intention that the claimed embodiments of the invention require more features than are expressly recited in each claim. Rather, inventive subject matter may lie in less than all features of a single disclosed embodiment and/or example.

While certain exemplary embodiments have been described and shown in the accompanying drawings, it is to be understood that such embodiments are merely illustrative and not restrictive, and that embodiments are not restricted to the specific constructions and arrangements shown and described since modifications may occur to those having ordinary skill in the art. For example, all optional features of the assembly structures as described above may also be implemented with respect to the methods described herein. In addition, various specific features in the examples may be used in one or more embodiments.

EXAMPLES

The following examples pertain to further embodiments.

Example 1 is a method of processing a plurality of die, comprising: identifying a wafer position for a plurality of die on a wafer; storing the wafer position for each of the plurality of die in a database; dicing the wafer into a plurality of singulated die; positioning each of the singulated die in a die position location on a tray; storing the die position on the tray for each of the singulated die in the database, wherein the database includes information including the wafer position associated with each die position; transporting the tray to a processing tool; removing at least one of the plurality of singulated die from the die position on the tray and processing the singulated die in the processing tool; and replacing the processed singulated die in the same defined location on the tray that the singulated die was positioned in prior to the processing.

In Example 2, the subject matter of Example 1 may optionally include positioning the tray in a carrier after the positioning each of the singulated die on the tray.

In Example 3, the subject matter of any of Examples 1-2 may optionally include providing a plurality of additional trays each including a plurality of singulated die from the wafer, wherein the tray and the additional trays each have a unique identifier thereon.

In Example 4, the subject matter of Example 3 may optionally include wherein the unique identifier includes a two-dimensional physical mark.

In Example 5, the subject matter of Example 3 may optionally include wherein the unique identifier includes an RFID tag.

In Example 6, the subject matter of any of Examples 3-5 may optionally include wherein the additional trays are positioned in the carrier.

In Example 7, the subject matter of any of Examples 3-6 may optionally include wherein the wafer is configured to include a plurality of regions on which the die are positioned, and wherein at least some of the trays are populated with singulated die from each of the regions.

In Example 8, the subject matter of Example 7 may optionally include wherein the trays with singulated die from each of the regions are transported to a different processing tool.

In Example 9, the subject matter of any of Examples 3-8 may optionally include wherein the additional trays are positioned in a plurality of additional carriers.

In Example 10, the subject matter of Example 9 may optionally include wherein the carrier and the additional carriers each have a unique identifier positioned thereon.

In Example 11, the subject matter of any of Examples 1-10 may optionally include wherein the tray includes a unique identifier thereon.

In Example 12, the subject matter of Example 11 may optionally include wherein the unique identifier is selected from the group consisting of a physical mark and an RFID tag.

In Example 13, the subject matter of any of Examples 11-12 may optionally include wherein the unique identifier is electronically identifiable.

In Example 14, the subject matter of any of Examples 1-13 may optionally include wherein the processing tool includes a recipe that accesses the database to determine processing parameters for the singulated die on the tray.

In Example 15, the subject matter of Example 14 may optionally include wherein different singulated die on the tray have different processing parameters.

In Example 16, the subject matter of any of Examples 1-15 may optionally include wherein the singulated die include no accessible unique identifying information thereon.

Example 17 is an assembly configured to hold a plurality of singulated die, comprising: a movable tray configured to support a plurality of singulated die, the tray including a raised step at an outer region thereof; and a lid adapted to cover the singulated die on the tray, wherein an outer edge of the lid engages an inner edge of the step.

In Example 18, the subject matter of Example 17 may optionally include wherein the tray includes a plurality of pockets defined on an upper surface thereof, wherein the pockets are each sized accept a single die therein.

In Example 19, the subject matter of any of Examples 17-18 may optionally include wherein the lid includes a plurality of pedestal structures protruding in a downward direction on a lower surface of the lid, wherein the pedestal structures are sized to extend a distance into the pockets when the lid is positioned on the tray.

In Example 20, the subject matter of any of Examples 17-19 may optionally include wherein the lid includes a spring on an upper surface thereof, the spring adapted to engage a surface above the lid and apply a force to hold the lid on the tray.

In Example 21, the subject matter of Example 20 may optionally include wherein the spring is configured as a leaf spring having a first end coupled to an upper surface of the lid and a second end spaced a distance away from the upper surface of the lid.

In Example 22, the subject matter of any of Examples 17-20 may optionally include wherein the lid includes a dome structure extending upward on an upper surface thereof, the dome structure configured to engage a surface above the lid and apply a force to hold the lid on the tray.

In Example 23, the subject matter of any of Examples 17-22 may optionally include wherein the tray includes a unique identifier thereon.

In Example 24, the subject matter of Example 23 may optionally include wherein the unique identifier comprises a two-dimensional physical mark on the tray.

Example 25 is a carrier configured to hold a plurality of trays, the trays configured to hold a plurality of singulated die, the carrier comprising: a plurality of rails configured to hold the trays thereon; wherein the trays are individually accessible in any order from the carrier; and a protrusion extending upward on an upper surface of the carrier, the protrusion configured to be coupled to an automated carrier handling system.

In Example 26, the subject matter of Example 25 may optionally include a patterned lower surface configured to engage a load port on a tool.

In Example 27, the subject matter of any of Examples 25-26 may optionally include wherein the protrusion has a substantially T-shaped cross-section.

In Example 28, the subject matter of any of Examples 25-27 may optionally include a structure extending downward from at least some of the rails, the structure configured to engage a tray lid as a lidded tray is positioned on the rails and apply a downward force on the tray lid.

In Example 29, the subject matter of Example 28 may optionally include wherein the structure is configured in the form of a leaf spring.

In Example 30, the subject matter of Example 28 may optionally include wherein the structure is configured in the form of a dome extending downward from a lower surface of a rail.

In Example 31, the subject matter of any of Examples 25-30 may optionally include an identification structure on the carrier.

In Example 32, the subject matter of Example 31 may optionally include wherein the identification structure comprises an RFID tag.

In Example 33, the subject matter of any of Examples 25-32 may optionally include wherein the rails are configured so that the carrier can accept two columns of multiple trays therein.

Example 34 is a tray configured to support a plurality of singulated die thereon, comprising: a core layer comprising a polymer; a plurality of electrodes positioned on the core layer; a dielectric layer positioned on the electrodes and extending therebetween, wherein the dielectric layer comprises a polymer; and a surface on which a plurality of singulated die may be positioned; wherein the electrodes are configured so that upon application of electric charge, adjacent electrodes have an opposite charge.

In Example 35, the subject matter of Example 34 may optionally include a power source positioned on the tray.

In Example 36, the subject matter of any of Examples 33-34 may optionally include a lid configured to be positioned on the tray.

In Example 37, the subject matter of any of Examples 34-36 may optionally include wherein the core comprises a laminated structure.

In Example 38, the subject matter of any of Examples 34-37 may optionally include a protective layer positioned on the dielectric layer, wherein an upper surface of the protective layer is the surface on which the plurality of singulated die may be positioned.

In Example 39, the subject matter of Example 38 may optionally include wherein the protective layer comprises a polymer.

Example 40 is a method for positioning die on a tray, comprising: providing a tray including core layer comprising a polymer, a plurality of electrodes positioned on the core layer, a dielectric layer positioned on the electrodes and extending therebetween, wherein the dielectric layer comprises a polymer, and a surface on which a plurality of die may be positioned, wherein the electrodes are configured so that upon application of a voltage potential to induce an electric charge, adjacent electrodes have an opposite charge; positioning a plurality of die on the surface; and applying electric charge to the electrodes and generating an electrostatic force to hold the plurality of die to the surface.

In Example 41, the subject matter of Example 40 may optionally include performing positioning the tray in a carrier while the electrostatic force is holding the plurality of die to the surface.

In Example 42, the subject matter of any of Examples 40-41 may optionally include positioning additional trays in the carrier.

In Example 43, the subject matter of any of Examples 40-42 may optionally include moving the carrier to a processing tool while the electrostatic force is holding the plurality of die to the surface.

In Example 44, the subject matter of Example 43 may optionally include removing at least one of the die from the surface of the tray and processing the at least one die in the tool.

In Example 45, the subject matter of Example 44 may optionally include, after the processing the at least one die in the tool, replacing the at least one die on the tray in the same position the at least one die was in prior to the processing.

In Example 46, the subject matter of Example 45 may optionally include moving the carrier to another tool for additional processing.

Example 47 is a method for manufacturing a tray comprising: forming a core layer comprising a polymer; forming electrodes on the core layer; forming a dielectric material on the electrodes; and providing a surface on which a plurality of die may be positioned, wherein the electrodes are configured so that upon application of a voltage potential to induce an electric charge, adjacent electrodes have an opposite charge.

In Example 48, the subject matter of Example 47 may optionally include positioning a power source on the electrostatic tray.

In Example 49, the subject matter of any of Examples 46-47 may optionally include wherein the forming a core layer comprises laminating a plurality of layer together.

Example 50 is an assembly configured to hold a plurality of singulated die, comprising: means for supporting a plurality of singulated die using a tray; and means for covering the singulated die on the tray using a lid.

In Example 51, the subject matter of Examples 50 may optionally include means for uniquely identifying the tray.

Example 52 is a carrier configured to hold a plurality of trays, the trays configured to hold a plurality of singulated die, the carrier comprising: means for holding the trays in the carrier in a manner so that any tray may be removed from the carrier without moving a different tray; and means for coupling the carrier to an automated carrier handling system.

In Example 53, the subject matter of Example 52 may optionally include means for engaging a load port on a tool.

In Example 54, the subject matter of any of Examples 52-53 may optionally include means for applying a force to a lid on a tray within the carrier.

In Example 55, the subject matter of Example 54 may optionally include wherein the means for applying a force includes a structure protruding from the lid.

In Example 56, the subject matter of Example 54 may optionally include wherein the means for holding the trays includes rails, and wherein the means for applying a force includes a structure protruding from the rails.

In Example 57, the subject matter may include the formation of an assembly in accordance with any of Examples 1-16 and 40-49.

Example 58 is a computer program product, comprising a computer readable storage medium having computer readable program code embodied therein executable by a processor to implement a method or realize the apparatus of any one of Examples 1-56.

What is claimed:

1. An assembly configured to hold a plurality of singulated die, comprising:
   a tray configured to support a plurality of singulated die, the tray including a raised step at an outer region thereof; and
   a lid adapted to cover the singulated die on the tray, wherein an outer edge of the lid engages an inner edge of the step.

2. The assembly of claim 1, wherein the tray includes a plurality of pockets defined on an upper surface thereof, wherein the pockets are each sized accept a single die therein.

3. The assembly of claim 2, wherein the lid includes a plurality of pedestal structures protruding in a downward direction on a lower surface of the lid, wherein the pedestal structures are sized to extend a distance into the pockets when the lid is positioned on the tray.

4. The assembly of claim 1, the tray including an identifying feature thereon to distinguish the tray from another tray.

5. The assembly of claim 4, the identifying feature is selected from the group consisting of a two dimensional physical mark and an RFID tag.

6. The assembly of claim 1, the lid including an upper surface, the upper surface including a structure extending outward therefrom, the structure adapted to engage an external surface and transmit a force to hold the lid on the tray.

7. The assembly of claim 6, wherein the structure is selected from the group consisting of a dome structure and a spring structure.

8. The assembly of claim 1, further comprising an adhesive layer on the tray.

9. The assembly of claim 1, the lid including an inner surface, further comprising a structure extending from the inner surface towards the tray when the lid is positioned on the tray.

10. An assembly comprising:
    a tray configured to support a plurality of singulated die;
    an adhesive layer on the tray; and
    a lid configured to cover any singulated die on the tray.

11. The assembly of claim 10, further comprising an identifying feature on the tray to distinguish the tray from another tray.

12. The assembly of claim 11, wherein the identifying feature is selected from the group consisting of a two dimensional physical mark and an RFID tag.

13. The assembly of claim 10, the lid including a structure extending outward therefrom, the structure adapted to engage an external surface and transmit a force to hold the lid on the tray.

14. The assembly of claim 13, the structure selected from the group consisting of a dome structure and a spring structure.

15. The assembly of claim 10, wherein the adhesive layer comprises a tape.

16. The assembly of claim 10, the lid including an interior surface from which a plurality of structures extend towards the tray.

17. An assembly comprising:
    a tray configured to support a plurality of singulated die;
    a plurality of pockets on the tray, each pocket configured to accept a die therein;
    a lid configured to cover any singulated die in the pockets on the tray; and
    an identifying feature on the tray to distinguish the tray from another tray.

18. The assembly of claim 17, wherein the lid includes a lower surface including a plurality of structures extending therefrom.

19. The assembly of claim 17, wherein the lid includes a plurality of pedestal structures protruding in a downward direction on a lower surface of the lid, wherein the pedestal structures are sized to extend a distance into the pockets when the lid is positioned on the tray.

20. An assembly comprising:
a tray configured to support a plurality of singulated die;
a plurality of pockets on the tray, each pocket configured to accept a die therein; and
a lid configured to cover any singulated die in the pockets on the tray, the lid including a structure extending outward therefrom, the structure adapted to engage an external surface and transmit a force to hold the lid on the tray.

21. An assembly for use in a carrier, comprising:
a tray configured to support a plurality of singulated die thereon;
the tray including an adhesive layer thereon;
the tray including a surface configured to engage rails in a carrier
an identifying feature on the tray to distinguish the tray from another tray; and
a lid configured to cover the tray.

22. The assembly of claim 21, the lid including a structure extending outward therefrom, the structure adapted to engage an external surface and transmit a force to hold the lid on the tray.

* * * * *